United States Patent
Ozaki

(10) Patent No.: US 7,448,119 B2
(45) Date of Patent: Nov. 11, 2008

(54) METHOD OF PRODUCING A SURFACE ACOUSTIC WAVE DEVICE

(75) Inventor: Kyosuke Ozaki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/805,760

(22) Filed: May 23, 2007

(65) Prior Publication Data

US 2007/0278897 A1    Dec. 6, 2007

(30) Foreign Application Priority Data

Jun. 1, 2006    (JP) ............................ 2006-153776

(51) Int. Cl.
*H01L 41/053* (2006.01)
*H04R 10/10* (2006.01)

(52) U.S. Cl. .................... 29/25.35; 29/848; 29/856; 29/841; 310/313 R; 310/313 C; 310/349

(58) Field of Classification Search ............... 29/25.35, 29/594, 842, 843, 848, 856, 841; 310/313 R, 310/311, 313 B, 313 C, 340, 349, 365

See application file for complete search history.

(56) References Cited

U.S. PATENT DOCUMENTS 6,060,818 A * 5/2000 Ruby et al. ............ 29/25.35 X
7,246,421 B2 * 7/2007 Namba et al. ............... 29/25.35

FOREIGN PATENT DOCUMENTS

JP           09162689 A   *   6/1997
JP           2002-232260        8/2002

* cited by examiner

*Primary Examiner*—A. Dexter Tugbang
(74) *Attorney, Agent, or Firm*—Beyer Law Group LLP

(57) ABSTRACT

A method of producing a surface acoustic wave device includes a sacrificial-layer forming step of forming a sacrificial layer on a piezoelectric substrate so as to cover comb electrodes and reflectors, a space-forming-member forming step of forming a space-forming member while openings are formed near the reflectors along a surface of the sacrificial layer, a sacrificial-layer removing step of removing the sacrificial layer from the openings of the space-forming member, and a resin sealing step of sealing a surface acoustic wave element with sealing resin, the surface acoustic wave element having an excitation protection space formed between the reflectors and the comb electrodes by the space-forming member.

4 Claims, 10 Drawing Sheets

METHOD OF PRODUCING A SURFACE ACOUSTIC WAVE DEVICE

CLAIM OF PRIORITY

This application claims benefit of the Japanese Patent Application No. 2006-153776 filed on Jun. 1, 2006, which is hereby incorporated by reference.

BACKGROUND OF THE INVENTION

1. Field of the Invention

The present invention relates to a method of producing a surface acoustic wave device including a space-forming member for forming a space between a comb electrode and a reflector on a piezoelectric substrate, and to the surface acoustic wave device.

2. Description of the Related Art

In recent years, in a communications component or an electronic component, such as a portable telephone or a television receiver, a surface acoustic wave device (hereunder referred to as the "SAW device") is used as, for example, a resonator or a band-pass filter.

The SAW device has a structure in which a surface acoustic wave element is covered and sealed with sealing resin. The surface acoustic wave element has, for example, a comb electrode and a reflector formed on a surface of a piezoelectric substrate. The surface (a function area) of the piezoelectric substrate where the comb electrode and the reflector are formed is provided with a space-forming member that forms a predetermined space between the comb electrode and the reflector. When the piezoelectric substrate is sealed with the sealing resin, the sealing resin adheres to, for example, the comb electrode that is already formed on the piezoelectric substrate. This causes a function of excitation of a surface acoustic wave provided by the comb electrode to be inhibited. The space-forming member is provided to restrict the inhibition of the excitation function.

In a related method of producing a SAW device, such a space-forming member is formed by combining a cover and four side frames. More specifically, the space-forming member is formed by forming four side frames (which define the space-forming member) as a result of performing patterning using photolithography techniques, after laminating a dry film resist to a surface of a surface acoustic wave element. The space-forming member is formed as a box member, in which these four side frames correspond to wall surfaces and the cover corresponds to a bottom surface, by adhering a film (serving as the cover) to the four side frames.

However, in the related method of forming a SAW device, two steps, the step of forming the four side frames and the step of forming the cover as a result of adhering the film to the four side frames, are required to form the space-forming member. Therefore, the manufacturing process is complicated.

SUMMARY OF THE INVENTION

The present invention provides a method of producing a surface acoustic wave device and the surface acoustic wave device, which can overcome the aforementioned problems and which can easily form a space-forming member that forms a space between a comb electrode and a reflector formed on a piezoelectric substrate.

The present invention provides a method of producing a surface acoustic wave device comprising a piezoelectric substrate, a comb electrode, and a reflector. The comb electrode converts a surface acoustic wave, which is generated at the piezoelectric substrate, and an electrical signal into each other. The reflector is disposed adjacent to the comb electrode as viewed in a direction of propagation of the surface acoustic wave and reflects the surface acoustic wave propagating along the piezoelectric substrate towards the comb electrode. At least a surface of the piezoelectric substrate is sealed by sealing resin while a space that covers an area, where the comb electrode and the reflector are formed, of the surface of the piezoelectric substrate remains.

According to a first aspect of the present invention, the method comprises an etching step, a sacrificial-layer forming step, a space-forming-member forming step, a sacrificial-layer removing step, and a resin sealing step. In the etching step, a metallic film formed on the surface of the piezoelectric substrate is etched to form, when completed, the comb electrode and the reflector at the surface of the piezoelectric substrate (hereunder referred to as the "predetermined propagation direction") so as to be arranged in a predetermined direction of propagation of the surface acoustic wave. In the sacrificial-layer forming step, a sacrificial layer, having an external shape corresponding to a shape of the space, is formed at a location on the surface of the piezoelectric surface so as to cover the comb electrode and the reflector and so as to extend along the predetermined propagation direction. In the space-forming-member forming step, a space-forming member is formed by adhering a material along an outer surface of the sacrificial layer extending along the predetermined propagation direction, the space-forming member that is formed being disposed on the surface of the piezoelectric substrate while surrounding the outer surface of the sacrificial layer, extending along the predetermined propagation direction, and having an opening. The opening is disposed at an end of the space-forming member as viewed in the predetermined propagation direction and exposes the sacrificial layer. In the sacrificial-layer removing step, the sacrificial layer is removed from the surface of the piezoelectric substrate through the opening of the space-forming member. In the resin sealing step, after removing the sacrificial layer, the surface of the piezoelectric substrate is sealed with the sealing resin while the space is formed between the comb electrode and reflector by the space-forming member.

According to the first aspect, first, a comb electrode and a reflector are formed on a surface of a piezoelectric substrate to form a surface acoustic wave element (etching step). The surface acoustic wave element is an element providing a central function of the surface acoustic wave device of converting an externally input electrical signal into mechanical displacement (surface acoustic wave) of the piezoelectric substrate by the comb electrode and taking out the mechanical displacement again as the electrical signal by the comb electrode. Next, in the first aspect, a simple manufacturing process, in which a sacrificial layer is removed from an opening of a space-forming member that is formed along the sacrificial layer so as to cover the comb electrode and the reflector, is performed to form a space between the space-forming member, the comb electrode, and the reflector. This space contributes to ensuring good resonance characteristics of the surface acoustic wave element. Further, in the first aspect, while such a space-forming member is formed, the surface of the piezoelectric substrate is sealed with sealing resin to produce the surface acoustic wave device. The sealing resin stops at the outer side of the space-forming member due to the viscosity of the sealing resin, so that it enters the inside space by only a small amount.

During the sealing, the sealing resin may enter the space, which is formed between the space-forming member and the comb electrode and between the space-forming member and the reflector, from the opening of the space-forming member. However, in the first aspect, since the reflector, instead of the comb electrode, is formed near this opening, even if the sealing resin enters the space, the sealing resin does not come into contact with the comb electrode even though it may come into contact with a portion of the reflector.

It is generally known that the comb electrode has a greater influence on the resonance characteristics of the surface acoustic wave element than the reflector. However, in the first aspect, even if the space-forming member is formed by such a simple manufacturing process, the entering of the sealing resin into the space does not influence the function of the comb electrode. Therefore, in the surface acoustic wave device produced by the method according to the first aspect, similarly to the case in which an opening is not formed in a space-forming member (that is, the case in which the space-forming member has a closed structure), the comb electrode can excite a proper surface acoustic wave at the surface of the piezoelectric substrate.

In a first form, the sacrificial layer is formed of resin.

The first form has the feature that the sacrificial layer is formed of resin in addition to providing the operations of the first aspect. Therefore, the sacrificial layer can be etched in the sacrificial-layer removing step without influencing metals of which the comb electrode and the reflector are made, the space-forming member, and the piezoelectric substrate. The sacrificial layer may be formed of an organic material containing, for example, such resin, in addition to being formed of resin alone.

In a second form, the sacrificial layer is formed of silicon.

The second form has the feature that the sacrificial layer is formed of silicon in addition to providing the operations of the first aspect. Therefore, the sacrificial layer can be etched in the sacrificial-layer removing step without influencing metals of which the comb electrode and the reflector are made, the space-forming member, and the piezoelectric substrate. The sacrificial layer may be formed of an inorganic material containing, for example, such silicon, in addition to being formed of silicon alone.

In a third form, in the sacrificial-layer forming step, the sacrificial layer is formed beyond the reflector in the predetermined propagation direction, in addition to being formed in a range in which the sacrificial layer covers the comb electrode and the reflector, formed on the piezoelectric substrate.

In addition to providing the operations of the first aspect to the second form, the third form has the feature that the sacrificial layer, formed in the sacrificial-layer-forming step, not only covers the comb electrode and the reflector, but also separates the reflector from the opening at an end of the space-forming member in the predetermined propagation direction. Therefore, in the next space-forming-member forming step, when the space-forming member is formed along an outer surface of such a sacrificial layer, the formed space-forming member can define not only the space in the inner side thereof that covers the comb electrode and the reflector, but also a space (hereunder referred to as "resin receiving space") between the reflector and the opening at the end of the space-forming member.

According to the method of producing a surface acoustic wave device according to the present invention, when sealing the surface acoustic wave element, even if the sealing resin enters the inside of an inner peripheral surface of the space-forming member from the opening, the sealing resin that has entered the inside of the inner peripheral surface only fills the resin receiving space, so that it does not reach the reflector. In this case, even if the surface acoustic wave device is formed by sealing with the sealing resin the piezoelectric substrate provided with the space-forming member having an opening (that is, the piezoelectric substrate in a surface-acoustic-wave-element state), the functions of the comb electrode and the reflector are not impaired.

Moreover, according to the method of producing a surface acoustic wave device, even if a large amount of sealing resin enters the inside of the space-forming member from the opening, most of the sealing resin that has entered the inside of the space-forming member stops at the resin receiving space. In addition, even if a portion of the sealing resin reaches an end of the reflector, the end of the reflector does not contribute considerably to reflection of a surface acoustic wave, so that the essential function of the reflector is substantially not impaired. Therefore, the surface acoustic wave device produced by such a method allows the resonance characteristics of the built-in surface acoustic wave element to be properly ensured.

According to a second aspect of the present invention, there is provided a surface acoustic wave device. The surface acoustic wave device comprises a piezoelectric substrate, a comb electrode, a reflector, a space-forming member, and sealing resin. The comb electrode converts a surface acoustic wave, which is generated at a surface of the piezoelectric substrate, and an electrical signal into each other. The reflector is disposed on the surface of the piezoelectric substrate so as to be adjacent to the comb electrode in a direction of propagation of the surface acoustic wave, and reflects the surface acoustic wave propagating along the piezoelectric substrate towards the comb electrode. The space-forming member is disposed on the surface of the piezoelectric substrate and defines a space covering the comb electrode and the reflector. The sealing resin seals the space-forming member and an outer surface of the piezoelectric substrate. In particular, the space-forming member has a cover, an arm, and an opening. The cover extends along a direction of arrangement of the comb electrode and the reflector so as to be situated at a location that is separated from the surface of the piezoelectric substrate through the space. The arm extends between an outer edge of the cover and the surface of the piezoelectric substrate and constitutes a side wall defining the space. The opening is disposed near the reflector so as to be surrounded by the arm and the cover.

According to the second aspect, since the space-forming member defines a space at the surface where the comb electrode and the reflector are formed, a surface acoustic wave that is generated at the piezoelectric substrate by the comb electrode is not externally influenced. In addition, when forming the space-forming member, it is possible to use a simple method in which, after forming a mold (sacrificial layer), used to define the shapes of an arm and a cover, on the piezoelectric substrate, the arm and the cover are formed along the mold so as to cover the mold, to remove the mold from an opening.

The opening of the space-forming member is positioned near the reflector. Therefore, even if the sealing resin reaches an end of the reflector when sealing with the sealing resin the piezoelectric substrate that has become a surface acoustic wave element, it does not easily reach the comb electrode. Here, since the function at an end of the reflector is of a lower level than the function at the central portion of the reflector, even if the sealing resin that has entered from the opening contacts the reflector, its influence on the resonance characteristics when the sealing resin contacts an end of the reflector is small. Therefore, the surface acoustic wave device allows the comb electrode of the built-in surface acoustic wave element to function satisfactorily. Consequently, even if an opening is formed in the space-forming member, the surface acoustic wave element can exhibit good resonance characteristics.

In a first form, the space-forming member further has a resin receiving space extending from the opening to the reflector as viewed in the direction of propagation of the surface acoustic wave, and allowing the sealing resin to enter through the opening.

In addition to providing the operations of the second aspect, the first form has the feature that, even if a relatively large amount of sealing resin enters from the opening of the space-forming member when sealing the surface acoustic wave element with the sealing resin, the sealing resin that has entered from the opening stops at the resin receiving space, so that it does not reach the reflector. Therefore, in the surface acoustic wave device, since the reflector of the surface acoustic wave element can satisfactorily perform its function, the surface acoustic wave element exhibits good resonance characteristics even if an opening is formed in the space-forming member.

Moreover, according to the first form, even if an excessive amount of sealing resin enters from the opening of the space-forming member, most of the sealing resin fills the resin receiving space, and the remaining sealing resin that could not be contained in the resin receiving space only slightly contacts an end of the reflector and stops. According to such a structure, even if an excessive amount of sealing resin enters from the opening, not only can the comb electrode satisfactorily perform its function, but also the reflector can substantially satisfactorily perform its function. Therefore, in the surface acoustic wave device, even if an excessive amount of sealing resin enters from the opening of the space-forming member when sealing the surface acoustic wave element with the sealing resin, this has a small influence on the resonance characteristics of the surface acoustic wave element.

The present invention can provide a method of producing a surface acoustic wave device and the surface acoustic wave device, which can easily form a space-forming member that forms a space between a comb electrode and a reflector formed on a piezoelectric substrate.

DESCRIPTION OF THE PREFERRED EMBODIMENTS

Preferred embodiments of the present invention will hereunder be described with reference to the drawings.

First Embodiment

Figure 1:
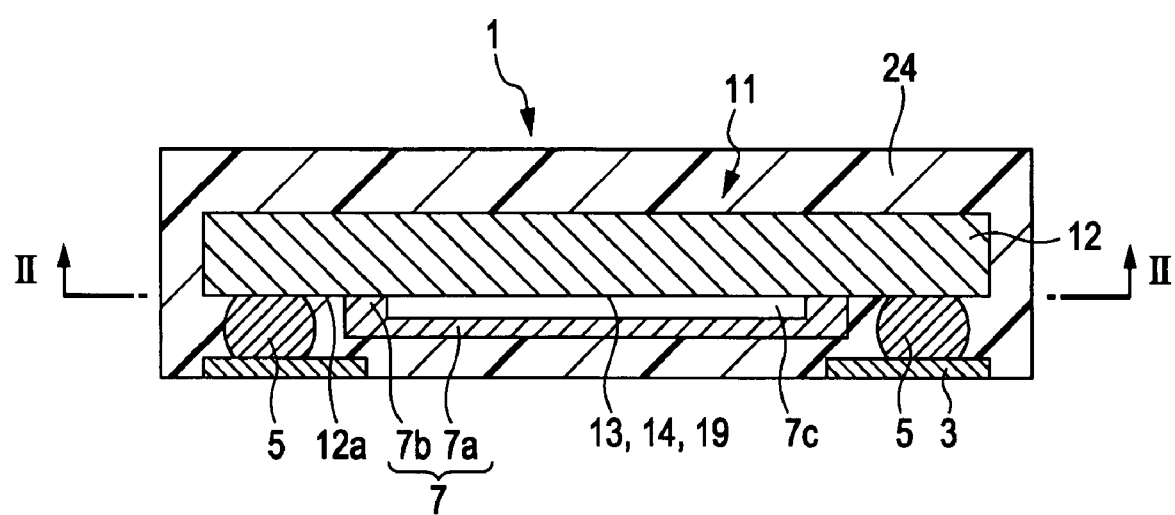
FIG. 1 is a sectional view of a structure of a surface acoustic wave ("SAW") device according to a first embodiment of the present invention.
Figure 2:
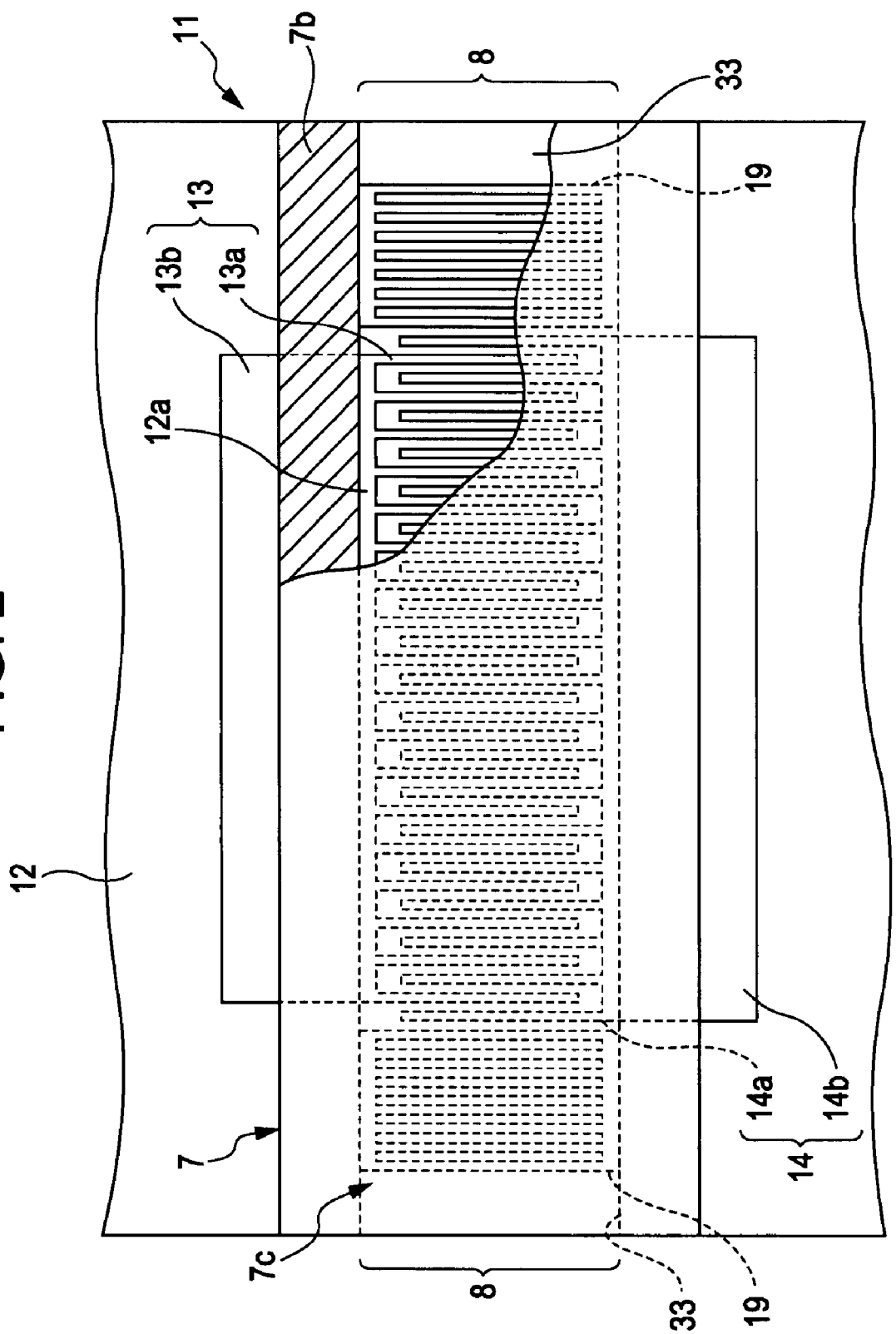
FIG. 2 is a sectional view of the structure taken along line II-II of the SAW device shown in FIG. 1.

FIGS. 1 and 2 are sectional views of a structure of a surface acoustic wave device according to a first embodiment. The surface acoustic wave device shown in FIGS. 1 and 2 is an example of an electronic component that is generally called a SAW device. In each of the embodiments below, the surface acoustic wave device will be referred to as the "SAW device." A SAW device 1 is used to function as a resonator or a band-pass filter in a communications device or an electronic device, such as a portable telephone device or a television receiver. FIG. 2 is a sectional view of the structure taken along line II-II of the SAW device 1 shown in FIG. 1. In FIG. 2, structural features not included in the cross section are added as appropriate to help one understand the description.

The SAW device 1 has a structure in which a surface acoustic wave element 11 provided with metallic bumps 5 and lead frames 3 is sealed by sealing resin 24. The sealing resin 24 is, for example, silicon oxide ($SiO_2$). Each lead frame 3 is an external electrode for performing inputting/outputting of a high-frequency signal between it and the outside of the SAW device 1. Each metallic bump 5 is a protruding electrode for electrically connecting the surface acoustic wave element 11 to the lead frames 3.

The surface acoustic wave element 11 has a piezoelectric substrate (SAW device substrate) 12. A comb electrode 13 and a comb electrode 14 form an Interdigital Transducer. A comb electrode 13, a comb electrode 14, and a pair of reflectors 19 are formed on a principal surface 12a (that is, a surface where a surface acoustic wave is generated and propagated) of the piezoelectric substrate 12. In addition, a space-forming member 7 is disposed at the principal surface 12a of the piezoelectric substrate 12 so as to cover the comb electrodes 13 and 14 and the reflectors 19. The space-forming member 7 has a space 7c that is formed between the comb electrodes 13 and 14 and the pair of reflectors 19, which are formed on the piezoelectric substrate 12. The space 7c is provided to efficiently propagate a surface acoustic wave along the principal surface 12a of the piezoelectric substrate 12 to ensure a good excitation state by the comb electrodes 13 and 14. Accordingly, in the space 7c, the principal surface 12a of the piezoelectric substrate 12 and the comb electrodes 13 and 14 do not contact the sealing resin 24. In the embodiment, the space 7c will hereunder be referred to as the "excitation protection space."

The space-forming member 7 includes a cover 7a and a pair of arms 7b, which define the excitation protection space 7c. The cover 7a is a flat plate extending in a direction of arrangement of the comb electrodes 13 and 14 and the reflectors 19. The pair of arms 7b are side walls extending to the principal surface 12a of the piezoelectric substrate 12 from respective ends of the cover 7a extending parallel to a direction of propagation of a surface acoustic wave. The arms 7b define the excitation protection space 7c along with the cover 7a.

In the surface acoustic wave element 11, the reflectors 19, an electrode unit (not shown), and a wiring pattern (not shown) are formed on the piezoelectric substrate 12. The piezoelectric substrate 12 is formed of, for example, LT (lithium tantalate ($LiTaO_3$)) or LN (lithium niobate ($LiNbO_3$)).

The electrode unit includes the comb electrode 13, the comb electrode 14, and a wiring pad (not shown). The comb electrode 13 includes a base 13b and comb portions 13a extending in the form of a comb along the surface of the piezoelectric substrate 12 from the base 13b. The comb electrode 14 has substantially the same structure as the comb electrode 13, and includes a base 14b and comb portions 14a extending in the form of a comb along the surface of the piezoelectric substrate 12 from the base 14b. The comb portions 13 and the comb portions 14 are arranged so as to alternate at a certain interval. The direction of arrangement matches the direction of generation and propagation of a surface acoustic wave at the principal surface 12a of the piezoelectric substrate 12.

The wiring pad (not shown) is a wiring electrode for connecting each surface acoustic wave element 11 to an external circuit (not shown). The external circuit is a circuit for inputting a high-frequency signal to the wiring pad. In the description below, this high-frequency signal will be referred to as the "high-frequency input signal."

The pair of reflectors 19 are constructed so that a plurality of electrode patterns that are elongated perpendicularly to the direction of propagation of a surface acoustic wave are arranged in interdigital form. As viewed from the direction of propagation of a surface acoustic wave, the reflectors 19 are disposed adjacent to the respective sides of the comb electrodes 13 and 14. Here, "the direction of propagation" refers to a main direction in which a surface acoustic wave is propagated by excitation of the comb electrodes 13 and 14. The reflectors 19 reflect the surface acoustic wave that propagates along the surface of the piezoelectric substrate 12 towards the comb electrodes 13 and 14, and confines the energy of the surface acoustic wave in the interior of the surface acoustic wave element 11.

As shown in FIG. 1, the cross section of the space-forming member 7 is U-shaped when viewed from the direction of propagation of a surface acoustic wave, and the space 7c is formed in a groove-like portion in the U-shaped portion. The space-forming member 7 has rectangular openings 8 at respective ends of the space-forming member 7 when viewed from the direction of propagation of a surface acoustic wave. The openings 8 are surrounded by the arms 7b and the cover 7a of the space-forming member 7 and the principal surface 12a of the piezoelectric substrate 12. The openings 8 may be formed so as to extend into the cover 7a from both side ends of the space-forming member 7. The openings 8 are formed at locations that are situated in directions opposite to the directions of reflection by the pair of reflectors 19 (that is, opposite to the directions of reflection of a propagated surface acoustic wave). More specifically, in the embodiment, the openings 8 are formed at respective sides of the space-forming member 7 as viewed in the direction of propagation of a surface acoustic wave. That is, in the space-forming member 7, the excitation protection space 7c extending between the two openings 8 in the form of a tunnel is formed between an inner surface defining the space-forming member 7 and the principal surface 12a of the piezoelectric substrate 12.

Moreover, in the embodiment, resin receiving spaces 33 are provided in the excitation protection space 7c so as to be disposed between the openings 8 and the respective reflectors 19. The resin receiving spaces 33 are spare spaces that allow the sealing resin 24 to enter the space 7c from the openings 8 when the surface acoustic wave element 11 is molded using the sealing resin 24, but prevent the sealing resin 24 from reaching the reflectors 19 at this time. A resin receiving space 33 may be formed at least one of the two openings 8.

The surface acoustic wave element 11 has the above-described general structure. Next, an operation of the surface acoustic wave element 11 will be simply described with reference to FIGS. 1 and 2. A high-frequency input signal is supplied to the wiring pad from the external circuit through the wiring pattern. The wiring pad is connected to the comb electrode 14, and the high-frequency input signal is supplied to the comb electrode 14 through the wiring pad.

When the high-frequency signal is supplied to the comb electrode 14, an inverse piezoelectric effect is made to occur at the comb portions 14a of the comb electrode 14 by an electrical field that is generated by the high-frequency input signal, so that a surface of the piezoelectric substrate 12 is mechanically displaced. This causes a surface acoustic wave to be generated at the piezoelectric substrate 12. The surface acoustic wave primarily propagates in the direction of arrangement of the comb portions 14a. At this time, the pair of reflectors 19 reflect the propagating surface acoustic wave to restrict loss of energy of the surface acoustic wave.

The surface acoustic wave propagates through the comb portions 13a, forming a pair with the comb portions 14a. By a piezoelectric effect based on displacement of the surface of the piezoelectric substrate 12 caused by the propagated surface acoustic wave, the comb portions 13a can detect a frequency signal of a particular bandwidth (hereunder referred to as "particular bandwidth frequency signal") in accordance with the displacement. The particular bandwidth frequency signal is taken out from the wiring pad, connected to the comb electrode 13, through the base 13b.

The SAW device 1 has the above-described structure. Next, an example of a method of producing the SAW device 1 according to the first embodiment will be described. FIGS. 3 to 12 are sectional views illustrating the steps of the example of the method of producing the SAW device 1 according to the first embodiment. In addition, FIGS. 3 to 12 are sectional views of locations that are the same as those illustrated in the sectional view of FIG. 1.

Etching Step

Figure 3:
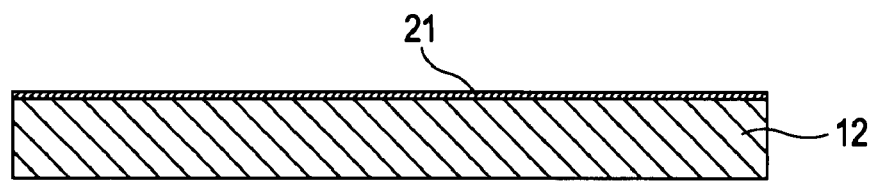
FIG. 3 is a sectional view showing a state in which a metallic film is formed on a piezoelectric substrate.
Figure 4:
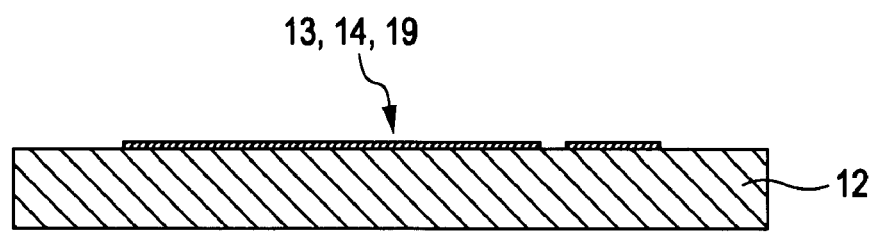
FIG. 4 is a sectional view showing a state in which comb electrodes and reflectors are formed on the piezoelectric substrate by portions of the metallic film remaining after etching.

First, as shown in FIG. 3, a metallic film 21 is deposited onto a piezoelectric substrate (SAW device substrate) 12. After depositing the metallic film 21 onto the piezoelectric substrate 12, the metallic film 21 is etched in accordance with a comb electrode 13, a comb electrode 14, reflectors 19, and a wiring pattern (not shown), to be formed. As shown in FIG. 4, remaining portions of the metallic film 21 become the comb electrodes 13 and 14, the reflectors 19, and the wiring pattern (not shown). That is, the comb electrodes 13 and 14, the reflectors 19, and the wiring pattern (not shown) are formed on a surface of the piezoelectric substrate 12 by the remaining portions of the metallic film 21. In the embodiment, a state in which the comb electrodes 13 and 14, etc., are formed on the surface of the piezoelectric substrate 12 is called "surface acoustic wave element 11." For the sake of simplifying the figures, the comb electrodes 13 and 14, the reflectors 19, etc., are not shown in FIG. 5 onward for convenience.

Sacrificial-Layer Forming Step

Figure 5:
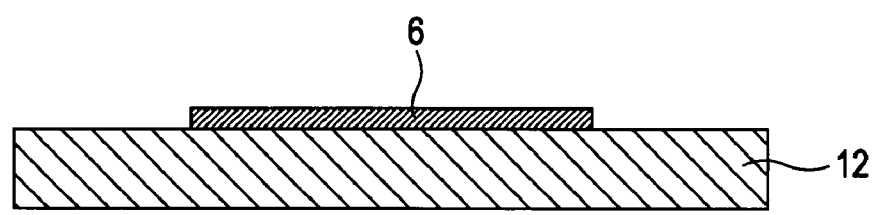
FIG. 5 is a sectional view showing a state in which a sacrificial layer having an external form that is the same as the form of an excitation protection space is formed on the piezoelectric substrate.

Next, in the sacrificial-layer forming step, as shown in FIG. 5, a sacrificial layer 6 is formed on the piezoelectric substrate 12 so as to cover the comb electrodes 13 and 14 and the reflectors 19. The illustrated rectangular cross-sectional shape of the sacrificial layer 6, formed by the sacrificial-layer forming step, finally corresponds to the cross-sectional shape of a space 7c.

More specifically, first, after the etching step, in the sacrificial-layer forming step, a film, which becomes the sacrificial layer 6 and which is formed of either an organic material (such as resin) or an inorganic material (such as silicon (Si)), is formed on the entire surface of the piezoelectric substrate 12 by any one of the following methods, such as sputtering, chemical vapor deposition (CVD), spin coating, and printing. The material of the sacrificial layer 6 is not limited to resin, so that it may be of any composition as long as etching can be performed using an etching liquid without influencing the comb electrode 13, the reflectors 19, the piezoelectric substrate 12, and a space-forming member 7.

Further, in the sacrificial-layer forming step, unnecessary portions, which are portions other than those covering comb portions 13a and 14a and the reflectors 19, are etched to form the thin rectangular-parallelepiped sacrificial layer 6 on the comb portions 13a and 14a and the reflectors 19. As a result, the sacrificial layer 6 having a thickness of, for example, approximately 1 to 50 μm is formed on the piezoelectric substrate 12. The sacrificial layer 6 is formed so that, for example, surfaces extending along the direction of propagation of a surface acoustic wave (that is, a surface that is parallel to a principal surface of the piezoelectric substrate 12 and both side surfaces adjacent to this parallel surface) extend parallel to the direction of propagation of a surface acoustic wave. At this time, in the sacrificial-layer forming step, it is desirable that the sacrificial layer 6 extend further than the positions of the reflectors 19 so that the reflectors 19 are further separated from respective openings 8. Here, the portions of the sacrificial layer 6 where the reflectors 19 are separated from the openings 8 corresponds to resin receiving spaces 33 that are formed later.

Space-Forming-Member Forming Step

Figure 6:
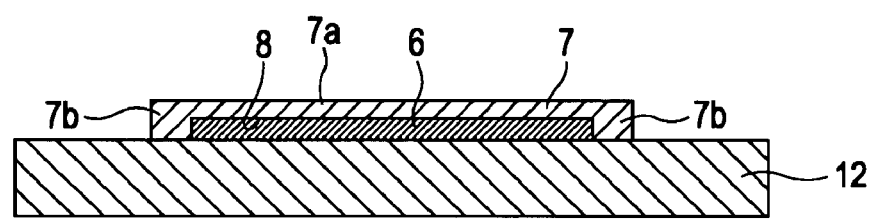
FIG. 6 is a sectional view showing a state in which a space-forming member is formed along a surface of the sacrificial layer on the piezoelectric substrate.

Next, in a space-forming-member forming step, first, as shown in FIG. 6, resin resist, such as an epoxy resin resist, is deposited to, for example, a thickness that is greater than the thickness of the sacrificial layer 6 so as to extend along a surface of the sacrificial layer 6 formed on the piezoelectric substrate 12. Then, in the space-forming-member forming step, the space-forming member 7 is integrally formed by photolithography techniques using photosensitive resin. The space-forming member 7 is formed into a bridge form in cross section by a cover 7a and arms 7b. At this time, the formed space-forming member 7 has the openings 8 (rather, at this stage, portions that are to become the openings 8) formed near the reflectors 19. That is, the space-forming member 7 having the openings 8 near the reflectors 19 is formed along the surface of the sacrificial layer 6 on the piezoelectric substrate 12.

Metallic-Bump Forming Step

Figure 7:
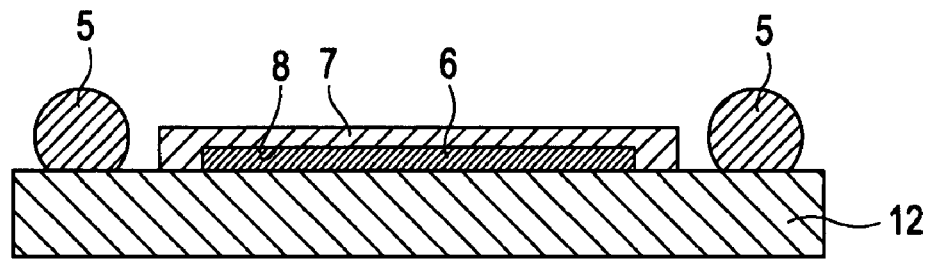
FIG. 7 is a sectional view showing a state in which metallic bumps are formed at bases of the comb electrodes at respective sides of the space-forming member.

Next, in a metallic-bump forming step, as shown in FIG. 7, metallic bumps 5 are formed on respective sides of the space-forming member 7 (that is, respective sides of the comb electrodes 13 and 14 and the reflectors 19) so as to achieve electrical connection with the wiring pattern (not shown) formed on the piezoelectric substrate 12.

Sacrificial-Layer Removing Step

Figure 8:
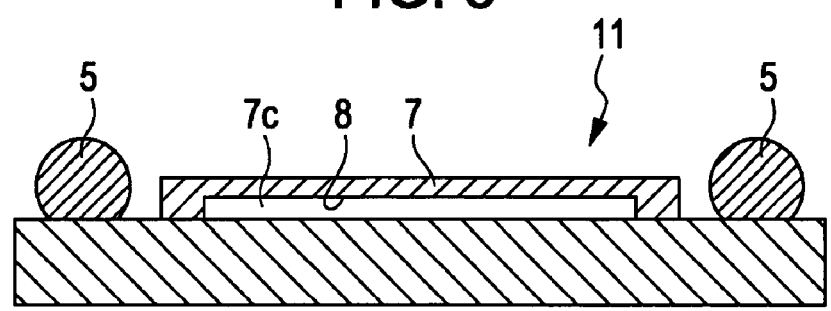
FIG. 8 is a sectional view showing a state in which the excitation protection space is formed as a result of removing the sacrificial layer with which the inside of the space-forming member is filled.

In a sacrificial-layer removing step, as shown in FIG. 8, the sacrificial layer 6 with which the space-forming member 7 is filled is removed from the openings 8 by, for example, isotropic etching using etching liquid to form the excitation protection space 7c between the space-forming member 7 and each of the comb portion 13a, the comb portion 14a, and the reflectors 19. Here, since, in the interior of the space-forming member 7 (corresponding to where the excitation protection space 7c is formed), the isotropic etching progresses properly through both openings 8, the sacrificial layer 6 can be easily removed.

Flip-Chip Bonding

Figure 9:
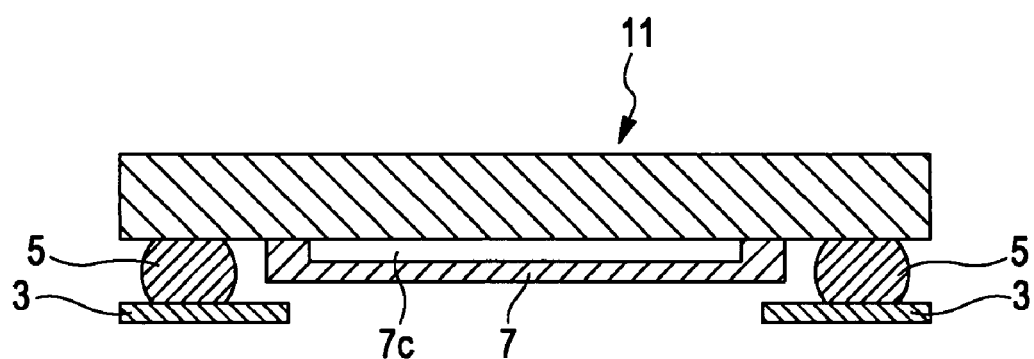
FIG. 9 is a sectional view showing a state in which a chip is mounted as a result of joining the metallic bumps to lead frames.

In a flip-chip bonding step, as shown in FIG. 9, an ultrasonic wave is applied while pressing the metallic bumps 5 against lead frames 5, and the metallic bumps 5 are joined to the lead frames 3 to mount a chip.

Resin Sealing Step

Figure 10:
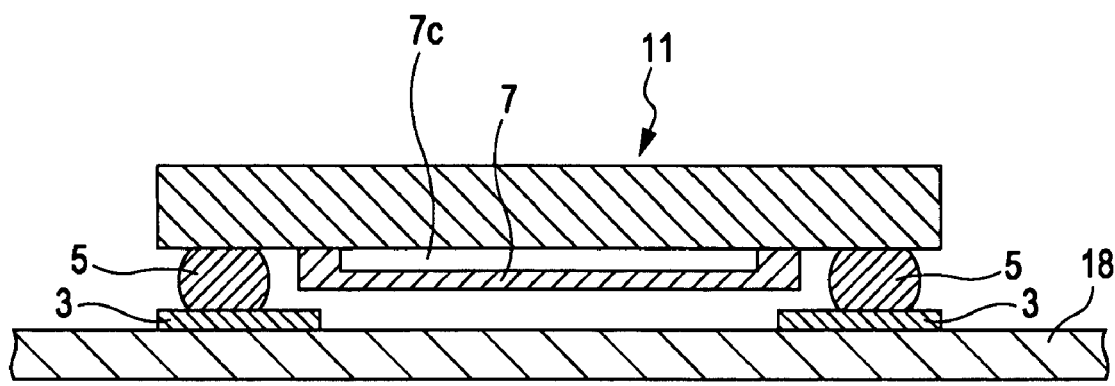
FIG. 10 is a sectional view showing a state in which the lead frames of a surface acoustic wave element in which the chip is mounted are adhered to a single-molding tape.
Figure 11:
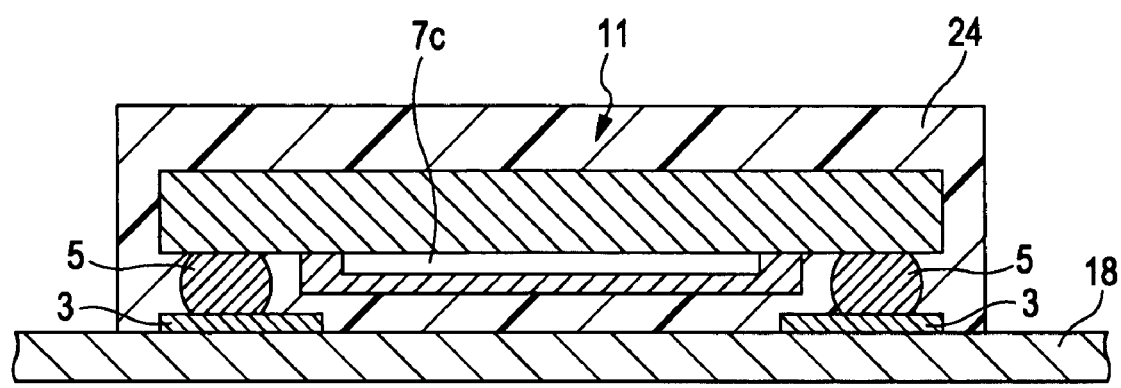
FIG. 11 is a sectional view showing a state in which the surface acoustic wave element having the excitation protection space is molded using sealing resin.

In a resin sealing step, first, for example, as shown in FIG. 10, the lead frames 3 are adhered to a single-molding tape 18 for the surface acoustic wave element 11 in which the chip is mounted. Then, in the resin sealing step, as shown in FIG. 11, the surface acoustic wave element 11 having the excitation protection space 7c is molded (sealed) using sealing resin 24. The sealing resin 24 may enter the excitation protection space 7c through the openings 8 at the respective ends (as viewed in the direction of propagation of a surface acoustic wave) of the space-forming member 7. However, such entering of the sealing resin 24 is due to capillary phenomenon, so that, due to its viscosity, the sealing resin 24 does not enter by an excessive amount, as a result of which the sealing resin 24 generally stops before reaching the reflectors 19. Therefore, the excitation protection space 7c is not eroded by the sealing resin 24, so that the excitation state of the comb portions 13a and 14a can be properly protected at the completion of the formation of the excitation protection space 7c.

Dicing Step to Tape Peeling Step

Figure 12:
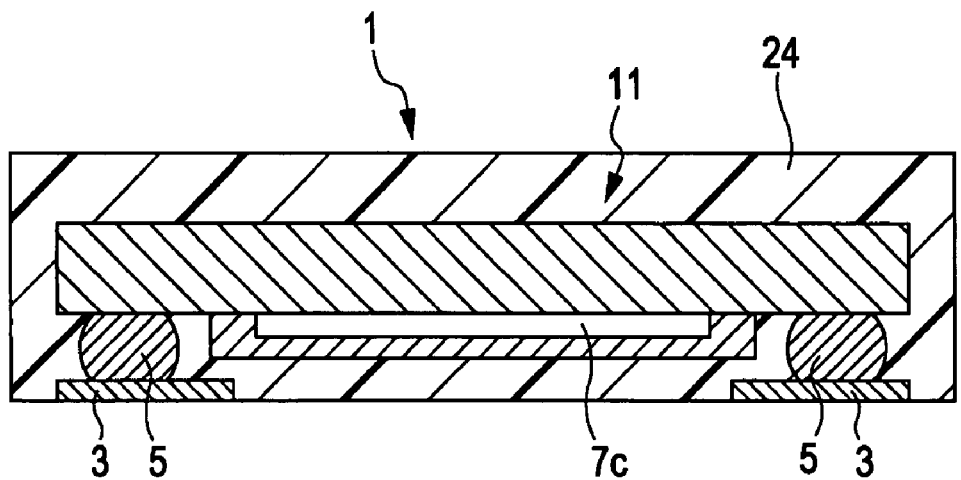
FIG. 12 is a sectional view showing a state in which the single-molding tape is peeled from the surface acoustic wave element that has been molded using the sealing resin.

Next, the surface acoustic wave element 11 that has been molded using the sealing resin 24 is diced according to surface acoustic wave elements 11, and the single-molding tape 18 is peeled off, so that individual SAW devices 1 are formed as shown in FIG. 12.

According to the first embodiment, the excitation protection space 7c can be formed between the space-forming member 7 and each of the comb electrodes 13 and 14 and the reflectors 19 by a simple producing process in which, after forming the space-forming member 7 along the sacrificial layer 6, which is formed so as to cover the comb electrodes 13 and 14 and the reflectors 19, the sacrificial layer 6 is removed from the openings 8 of the space-forming member 7. In addition, according to the first embodiment, a SAW device 1 is formed by sealing the surface acoustic wave element 11 having such a space-forming member 7 with the sealing resin 24.

As mentioned above, the sealing resin 24 may enter the excitation protection space 7c from the openings 8 when performing the resin sealing step. However, in the first embodiment, the openings 8 are formed near the reflectors 19 instead of near the comb electrodes 13 and 14, so that, even if the sealing resin 24 enters the excitation protection space 7c, the sealing resin 24 does not contact the comb electrodes 13 and 14 though it may contact the reflectors 19.

It is generally known that the comb electrodes 13 and 14 have a greater influence on the resonance characteristics of the surface acoustic wave element 11 than the reflectors 19. However, in the first embodiment, even if the space-forming member 7 is formed by such a simple manufacturing process, the entering of the sealing resin 24 does not influence the functions of the comb electrodes 13 and 14. Therefore, in the first embodiment, similarly to the case in which an opening 8 is not formed in a space-forming member 7, the comb electrodes 13 and 14 can excite a surface acoustic wave in a proper state.

In addition, in the first embodiment, when the sacrificial layer 6 is formed of resin, the etching of the sacrificial layer 6 by the sacrificial-layer removing step can be carried out using etching liquid without influencing metals of which the comb electrodes 13 and 14 and the reflectors 19 are made, the space-forming member 7, and the piezoelectric substrate 12. The sacrificial layer 6 may also be formed of an organic material containing, for example, such resin, instead of being formed only of resin.

Further, in the first embodiment, when the sacrificial layer 6 is formed of silicon, the etching of the sacrificial layer 6 by the sacrificial-layer removing step can be carried out using etching liquid without influencing metals of which the comb electrodes 13 and 14 and the reflectors 19 are made, the space-forming member 7, and the piezoelectric substrate 12. The sacrificial layer 6 may also be formed of an inorganic material containing, for example, silicon, instead of being formed only of silicon.

In the SAW device 1 according to the first embodiment, since the excitation protection space 7c is formed at a surface of the surface acoustic wave element 11 where the comb electrodes 13 and 14 and the reflectors 19 are formed, the surface acoustic wave generated by the comb electrodes 13 and 14 is not externally influenced. Moreover, when forming the space-forming member 7, it is possible to use a simple method in which, after forming a mold (corresponding to the sacrificial layer 6), used to define the shapes of the arms 7b and the cover 7a, on the piezoelectric substrate 12, the arms 7b and the cover 7a are formed so as to cover the mold, to remove the mold from the openings 8.

In the SAW device 1 according to the first embodiment, as mentioned above, the openings 8 of the space-forming member 7 are positioned near the reflectors 19. Therefore, even if the sealing resin 24 reaches ends of the reflectors 19 when sealing the surface acoustic wave element 11 using the sealing resin 24, the sealing resin 24 does not reach the comb electrodes 13 and 14, so that it does not contact the comb electrodes 13 and 14. Here, since the function at an end of each reflector 19 is of a lower level than the function at the central portion of each reflector 19, even if the sealing resin 24 that has entered from the openings 8 contacts an end of each reflector 19, its influence on the resonance characteristics when the sealing resin 24 contacts an end of each reflector 19 can be made small. Therefore, the SAW device 1 allows the comb electrodes 13 and 14 of the built-in surface acoustic wave element 11 to function satisfactorily. Consequently, even if the openings 8 are formed in the space-forming member 7, the surface acoustic wave element 11 can exhibit good resonance characteristics.

In addition, the SAW device 1 according to the first embodiment includes resin receiving spaces 33 that allow entering of the sealing resin 24 and that extend from the openings 8 to the reflectors 19 in the space-forming member 7. Therefore, even if the amount of sealing resin 24 that enters from the openings 8 of the space-forming member 7 when sealing the surface acoustic wave element 11 with the sealing resin 24 becomes greater than average, the sealing resin 24 that has entered from the openings 8 stops at the resin receiving spaces 33, so that it does not reach the reflectors 19 disposed near the openings 8. Therefore, in the SAW device 1, since the reflectors 19 of the surface acoustic wave element 11 can satisfactorily perform their functions, the surface acoustic wave element 11 exhibits good resonance characteristics even if the openings 8 are formed in the space-forming member 7.

Moreover, even if an excessive amount of sealing resin 24 enters from the openings 8 of the space-forming member 7, most of the sealing resin 24 fills the resin receiving spaces 33, and the remaining sealing resin 24 that could not be contained in the resin receiving spaces 33 only slightly contacts the ends of the reflectors 19 and stops. Therefore, the comb electrodes 13 and 14 can still satisfactorily perform their functions. In addition, although the reflectors 19 are slightly influenced, this influence has little effect on the reflection performance at the ends of the reflectors 19, so that, practically speaking, the reflectors 19 can satisfactorily perform their functions. Accordingly, even if a large amount of sealing resin 24 enters from the openings 8 of the space-forming member 7 when sealing the surface acoustic wave element 11 with the sealing resin 24, it is possible to reduce the influence that this has on the resonance characteristics of the surface acoustic wave element 11.

Second Embodiment

Figure 13:
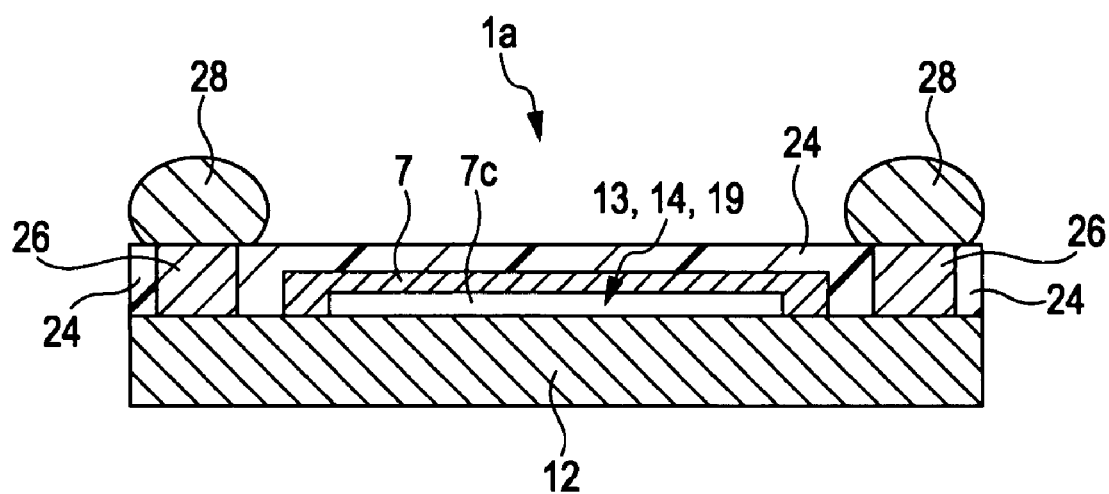
FIG. 13 is a sectional view of a structure of a surface acoustic wave device according to a second embodiment of the present invention.
Figure 14:
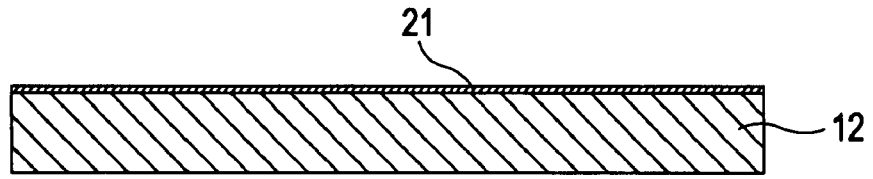
FIG. 14 is a sectional view showing a state in which a metallic film is formed on a piezoelectric substrate.
Figure 15:
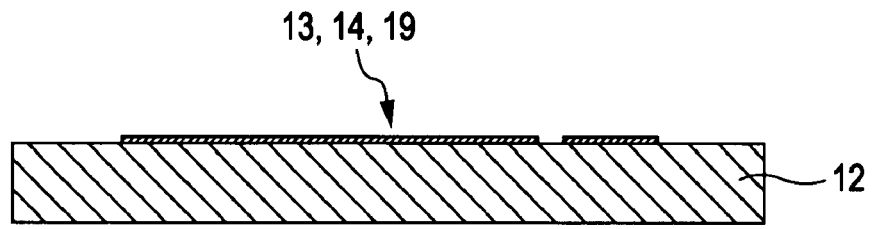
FIG. 15 is a sectional view showing a state in which comb electrodes and reflectors are formed on the piezoelectric substrate by portions of the metallic film remaining after etching.
Figure 16:
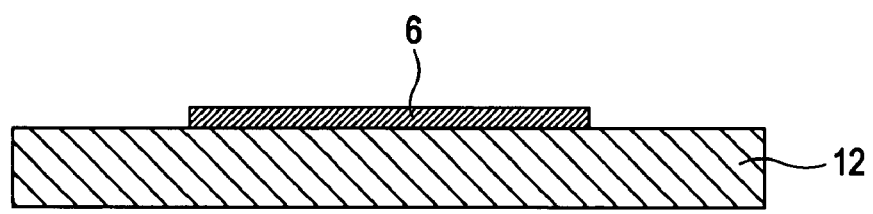
FIG. 16 is a sectional view showing a state in which a sacrificial layer having an external form that is the same as the form of an excitation protection space is formed on the piezoelectric substrate.
Figure 17:
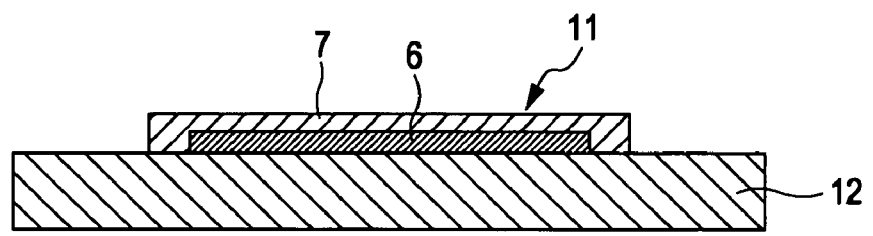
FIG. 17 is a sectional view showing a state in which a space-forming member is formed along a surface of the sacrificial layer on the piezoelectric substrate.

FIG. 13 is a sectional view of a structure of a SAW device 1a according to a second embodiment of the present invention.

The structural features and operations of the SAW device 1a according to the second embodiment are substantially the same as those of the SAW device 1 according to the first embodiment. Therefore, the same structural features and operations will not be described below, so that the description below will focus upon the differences. The structural features and operations according to the second embodiment that are the same as those according to the first embodiment will be referred to using the same reference numerals as those used in the first embodiment.

The structure of the SAW device 1a according to the second embodiment differs from that of the SAW device 1 according to the first embodiment in that it is what is called a wafer-level SAW package. In the SAW device 1a, a surface where a space-forming member 7 is not formed (that is, a surface where a comb electrode 13, etc., are not formed) is exposed to the outside, that is, it is not sealed using sealing resin 24.

In the SAW device 1a, a structure for exchanging signals between a surface acoustic wave element 11 and the outside of the sealing resin 24 differs from that of the SAW device 1 according to the first embodiment. That is, posts 26 are formed on a wiring pattern (not shown) on a piezoelectric substrate 12 of a surface acoustic wave element 11, and solder balls 28, serving as external electrodes, are connected to the posts 26 at the outer portions of the posts 26. The posts 26 are, for example, conductive members formed of copper (Cu).

The SAW device 1a according to the second embodiment has the above-described structure. Next, examples of steps of a method of producing the SAW device 1a will be described with reference to FIG. 13.

FIGS. 14 to 22 are sectional views illustrating an example of the method of producing the SAW device 1a according to the second embodiment, and illustrate exemplified cross-sectional structural features of portions that are the same as those illustrated in the sectional view of FIG. 1. Since the steps illustrated from FIGS. 14 to 17 are the same as the steps illustrated in FIGS. 3 to 6 in the first embodiment, descriptions thereof will be omitted.

Post Forming Step

Figure 18:
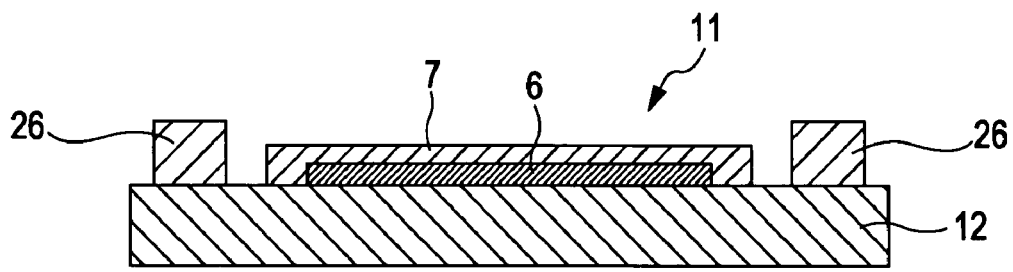
FIG. 18 is a sectional view showing a state in which posts are formed on respective sides of the space-forming member.

In a post forming step, as shown in FIG. 18, posts 26 are formed on respective sides of a space-forming member 7 (that is, respective sides of comb electrodes 13 and 14 and reflectors 19) so as to achieve electrical connection with a wiring pattern (not shown) formed on a piezoelectric substrate 12.

Sacrificial-Layer Removing Step

Figure 19:
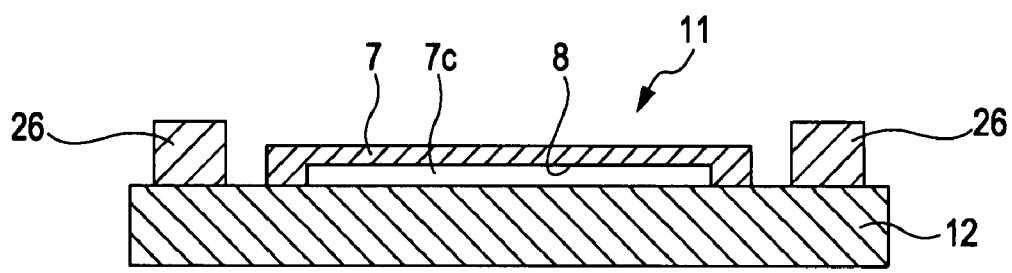
FIG. 19 is a sectional view showing a state in which the excitation protection space is formed as a result of removing the sacrificial layer with which the inside of the space-forming member is filled.

In a sacrificial-layer removing step, as in the first embodiment, a sacrificial layer 6 with which the space-forming member 7 is filled is etched by, for example, isotropic etching using an etching liquid. By this, as shown in FIG. 19, the sacrificial layer 6 is removed from openings 8 to form an excitation protection space 7c between the space-forming member 7 and each of the comb electrodes 13 and 14 and reflectors 19.

Resin Sealing Step and Grinding Step

Figure 20:
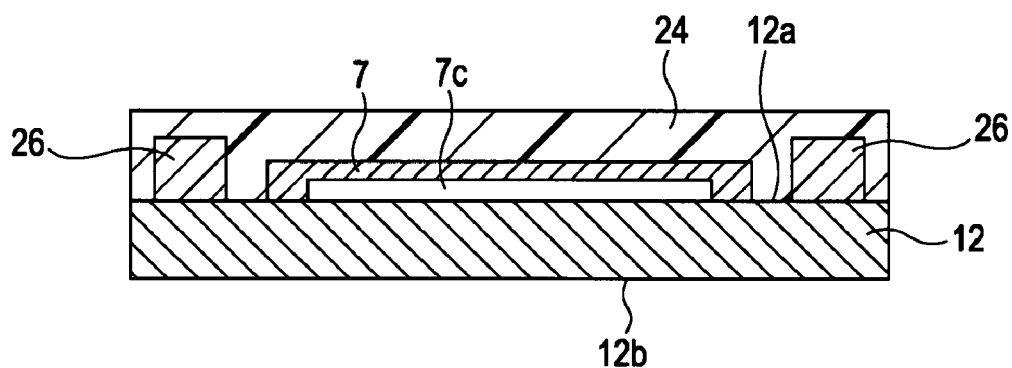
FIG. 20 is a sectional view showing a state in which molding is performed with sealing resin so as to cover a surface acoustic wave element provided with the posts.
Figure 21:
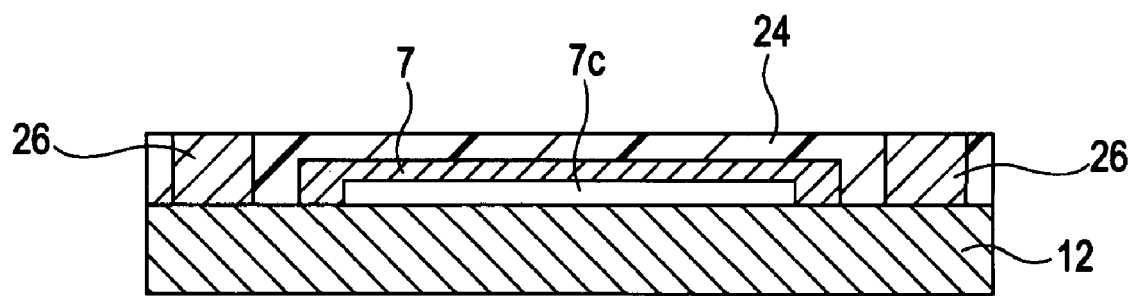
FIG. 21 is a sectional view showing a state in which the sealing resin formed on a surface of the piezoelectric substrate is scraped until the posts are exposed.

Next, in contrast to the first embodiment, in the second embodiment, a resin sealing step is executed without executing the flip-chip bonding step. In the resin sealing step, in contrast to the first embodiment, a surface acoustic wave element 11 provided with the posts 26 is molded using sealing resin 24 so as to cover the surface acoustic wave element 11 as shown in FIG. 20. This causes the surface acoustic wave element 11 to be formed so that a side of a principal surface 12a of the piezoelectric substrate 12 (that is, a surface where the comb electrodes 13 and 14, etc., are formed) is sealed by the sealing resin 24, whereas a side of a back surface 12b (that is, a surface where the comb electrodes 13 and 14, etc., are not formed) is exposed without being sealed by the sealing resin 24. In the resin sealing step, the surface acoustic wave element 11 is sealed by the sealing resin 24 so that the posts 26 disposed on the principal surface 12a of the piezoelectric substrate 12 are also covered. Further, in the resin sealing step, the sealing resin 24, formed on the principal surface 12a of the piezoelectric substrate 12, is scraped until the posts 26 are exposed as shown in FIG. 21 (grinding step).

Bump Forming Step to Dicing Step

Next, in a bump forming step, as shown in FIG. 13, solder balls 28 are formed on the posts 26 that are exposed from the outer surface of the sealing resin 24. When the solder balls 28 are formed, a plurality of SAW devices 1a formed by such a process are arranged on a wafer (not shown). (As a matter of convenience, the illustration is drawn in device units) Then, the wafer is diced to obtain individual SAW devices 1a.

In addition to providing the advantages of the first embodiment, the second embodiment makes it possible to form a space-forming member 7 by a simple method even when producing a plurality of SAW devices 1a all at once in wafer units.

Third Embodiment

Figure 22:
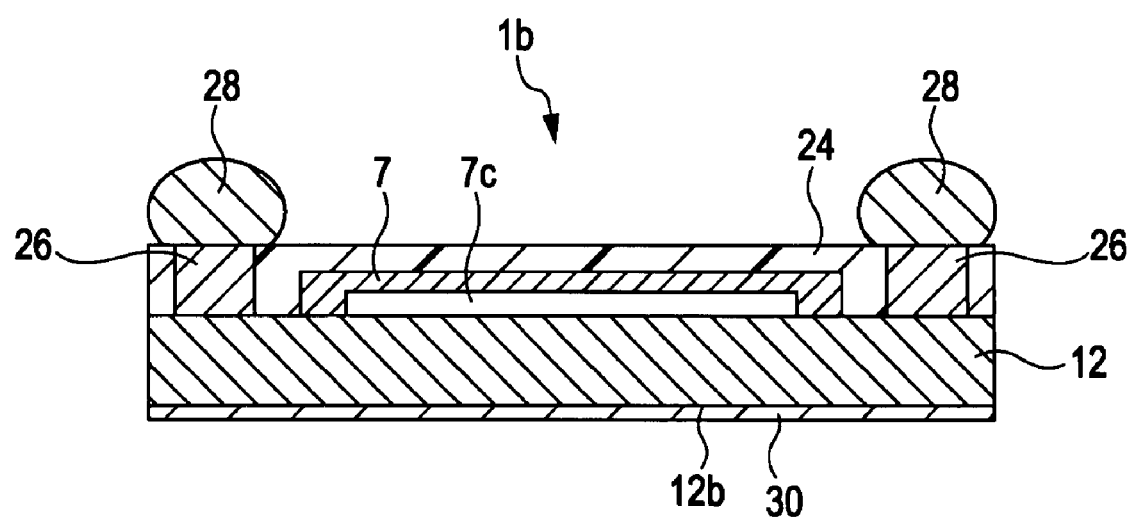
FIG. 22 is a sectional view of a structure of a surface acoustic wave device according to a third embodiment of the present invention.

FIG. 22 is a sectional view of a structure of a SAW device 1b according to a third embodiment of the present invention.

The structural features and operations of the SAW device 1b according to the third embodiment are substantially the same as those of the SAW device 1a according to the second embodiment. Therefore, the same structural features and operations will not be described below, so that the description below will focus upon the difference. The structural features and operations according to the third embodiment that are the same as those according to the first and second embodiments will be referred to using the same reference numerals as those used in the first and second embodiments.

The SAW device 1b according to the third embodiment is the same as the SAW device 1a according to the second embodiment in that it is what is called a wafer-level SAW package, but differs from the SAW device 1a in that it has a protective layer 30 deposited on a back surface 12b of a piezoelectric substrate 12. The protective layer 30 is formed of, for example, resin.

In addition to providing the advantages of the second embodiment, the third embodiment has the advantage that the piezoelectric substrate 12 can be protected from external shock or contact by the existence of the protective film 30.

Fourth Embodiment

Figure 23:
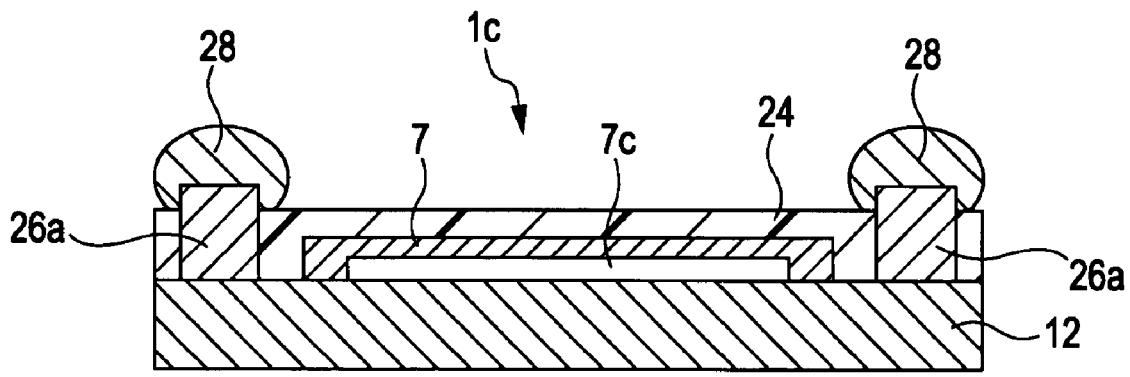
FIG. 23 is a sectional view of a structure of a surface acoustic wave device according to a fourth embodiment of the present invention.

FIG. 23 is a sectional view of a structure of a SAW device 1c according to a fourth embodiment of the present invention, the SAW device 1c being produced by a method of producing a SAW device.

The structural features and operations of the SAW device 1c according to the fourth embodiment are substantially the same as those of the SAW device 1a according to the second embodiment. Therefore, the same structural features and operations will not be described below, so that the description below will focus upon the difference. The structural features and operations according to the fourth embodiment that are the same as those according to the first and second embodiments will be referred to using the same reference numerals as those used in the first and second embodiments.

The SAW device 1c according to the fourth embodiment is the same as the SAW device 1a according to the second embodiment in that it is what is called a wafer-level SAW package, but differs from the SAW device 1a in the heights of posts 26a extending from a principal surface of a piezoelectric substrate 12. More specifically, in contrast to the second embodiment, in the fourth embodiment, the posts 26a protrude from a surface of sealing resin 24, and extend into the interior of solder balls 28. The posts 26a are, for example, conductive members formed of copper (Cu).

In addition to providing the advantages of the first and second embodiments, the fourth embodiment makes it possible to form the solder balls 28 as they are on the posts 26a that are originally exposed from the sealing resin 24, without exposing the posts 26a as a result of scraping the sealing resin 24 (with which a surface acoustic wave element 11 is molded as shown in FIG. 20) by the grinding step. Therefore, according to the fourth embodiment, since the grinding step can be omitted, the steps for producing the SAW device 1c can be simplified.

Fifth Embodiment

Figure 24:
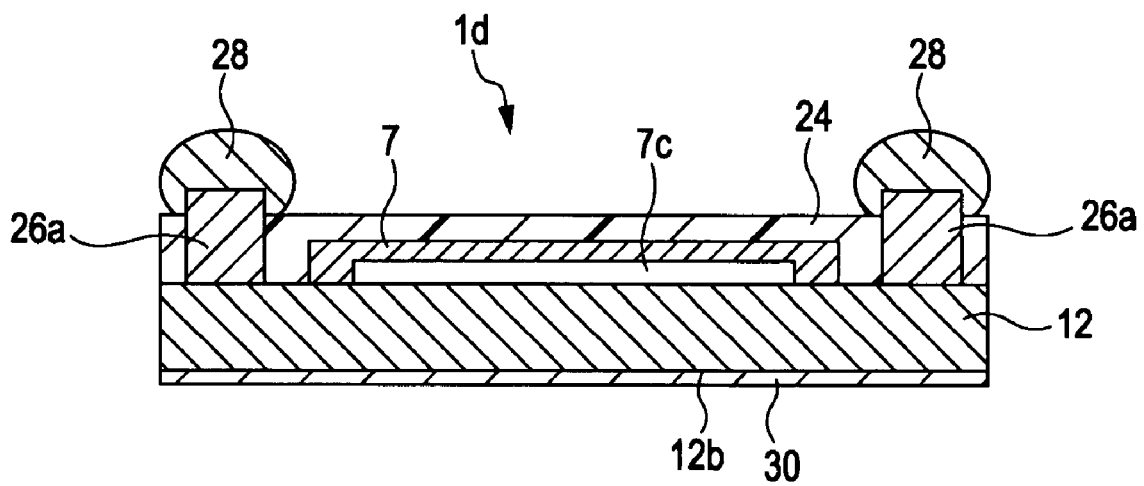
FIG. 24 is a sectional view of a structure of a surface acoustic wave device according to a fifth embodiment of the present invention.

FIG. 24 is a sectional view of a structure of a SAW device 1d according to a fifth embodiment of the present invention, the SAW device 1d being produced by a method of producing a SAW device.

The structural features and operations of the SAW device 1d according to the fifth embodiment are substantially the same as those of the SAW device 1b according to the third embodiment and the SAW device 1d according to the fourth embodiment. Therefore, the same structural features and operations will not be described below, so that the description below will focus upon the differences. The structural features and operations according to the fifth embodiment that are the same as those according to, for example, the third and fourth embodiments will be referred to using the same reference numerals as those used in the third and fourth embodiments.

The SAW device 1d according to the fifth embodiment is the same as the SAW device 1b according to the third embodiment and the SAW device 1c according to the fourth embodiment in that it is what is called a wafer-level SAW package. In addition, the heights of posts 26a extending from a principal surface of a piezoelectric substrate 12 are equal the heights of the posts 26a according to the fourth embodiment. However, the fifth embodiment differs from the third embodiment in that the posts 26a protrude from a surface of sealing resin 24, and reaches the interior of solder balls 28. In the fifth embodiment, a protective film 30 is deposited on a back surface 12b of the piezoelectric substrate 12. As in the third embodiment, the protective film 30 is formed of, for example, resin.

The fifth embodiment can provide the advantages provided by the third embodiment, and the advantages provided by the fourth embodiment.

The present invention is not limited to the above-described embodiments, so that various modifications may be made without departing from the scope of the claims. For example, in each of the embodiments, a structural feature may be omitted or structural features may be arbitrarily combined in a way that is different from that described above. Although, in the resin sealing step in the first embodiment, the surface acoustic wave element 11 having a chip is such that the lead frames 3 are adhered to the single-molding tape 18 as shown in FIG. 10, the present invention is not limited thereto. Accordingly, means in which the lead frames 3 are not secured to a tape may be used.

What is claimed is:

1. A method of producing a surface acoustic wave device comprising a piezoelectric substrate, a comb electrode, and a reflector, the comb electrode converting a surface acoustic wave, which is generated at the piezoelectric substrate, and an electrical signal into each other, the reflector being disposed adjacent to the comb electrode as viewed in a direction of propagation of the surface acoustic wave and reflecting the surface acoustic wave propagating along the piezoelectric substrate towards the comb electrode, at least a surface of the piezoelectric substrate being sealed by a sealing resin while a space is formed that covers an area, where the comb electrode and the reflector are formed, on the surface of the piezoelectric substrate, the method comprising:

an etching step of etching a metallic film formed on the surface of the piezoelectric substrate to form the comb electrode and the reflector at the surface of the piezoelectric substrate so as to be arranged in a predetermined direction of propagation of the surface acoustic wave when the etching step is completed;

a sacrificial-layer forming step of forming a sacrificial layer, having an external shape corresponding to a shape of the space, at a location on the surface of the piezoelectric surface so as to cover the comb electrode and the reflector and so as to extend along the predetermined direction;

a space-forming-member forming step of forming a space-forming member by adhering a material along an outer surface of the sacrificial layer extending along the predetermined direction, the space-forming member that is formed being disposed on the surface of the piezoelectric substrate while surrounding the outer surface of the sacrificial layer, extending along the predetermined direction, and having an opening, the opening being disposed at an end of the space-forming member as viewed in the predetermined direction and exposing the sacrificial layer;

a sacrificial-layer removing step of removing the sacrificial layer from the surface of the piezoelectric substrate through the opening of the space-forming member; and after the sacrificial-layer removing step, performing a resin sealing step of sealing the surface of the piezoelectric substrate with the sealing resin while the space is formed between the comb electrode and the reflector by the space-forming member.

2. The method of producing the surface acoustic wave device according to claim 1, wherein the sacrificial layer is formed of resin.

3. The method of producing the surface acoustic wave device according to claim 1, wherein the sacrificial layer is formed of silicon.

4. The method of producing the surface acoustic wave device according to claim 1, wherein, in the sacrificial-layer forming step, the sacrificial layer is formed beyond the reflector in the predetermined direction, in addition to being formed in a range in which the sacrificial layer covers the comb electrode and the reflector, formed on the piezoelectric substrate.

* * * * *